United States Patent
Huang et al.

(10) Patent No.: US 6,368,935 B1
(45) Date of Patent: Apr. 9, 2002

(54) METHOD FOR UPGRADING QUALITY OF DRAM CAPACITOR AND WAFER-TO-WAFER UNIFORMITY

(75) Inventors: Cheng-Chieh Huang; Tommy Yu, both of Hsin-Chu (TW)

(73) Assignee: United Microelectronics Corp. (TW)

(*) Notice: Subject to any disclaimer, the term of this patent is extended or adjusted under 35 U.S.C. 154(b) by 0 days.

(21) Appl. No.: 09/774,455

(22) Filed: Jan. 31, 2001

(51) Int. Cl.$^7$ ............................................. H01L 21/20

(52) U.S. Cl. .................... 438/398; 438/255; 438/507; 438/509

(58) Field of Search ............................... 438/253, 398, 438/255, 507, 509

(56) References Cited

U.S. PATENT DOCUMENTS 5,888,295 A * 3/1999 Sandhu et al. .............. 438/398

* cited by examiner

Primary Examiner—Charles Bowers
Assistant Examiner—Yennhu B. Huynh
(74) Attorney, Agent, or Firm—Thomas T. Moga, Esq.

(57) ABSTRACT

A method for upgrading qualities of DRAM capacitors and wafer-to-wafer uniformity is disclosed. In order to effectively prevent wafers from contaminations, the invention uses an additional silane purge process in situ before performing a SHSG seeding process on the wafers. The silane purge process of this invention utilizes the original silane seeding gas inlet. In this manner, not only thicknesses and surface areas of the SHSG seeds and capacitances of DRAMs can be increased, but also wafer-to-wafer uniformity can be upgraded.

20 Claims, 4 Drawing Sheets

METHOD FOR UPGRADING QUALITY OF DRAM CAPACITOR AND WAFER-TO-WAFER UNIFORMITY

BACKGROUND OF THE INVENTION

1. Field of the Invention

The present invention relates to a method for upgrading qualities of dynamic random access memories (DRAM) and more particularly to a method for upgrading qualities of DRAM capacitors and wafer-to-wafer uniformity.

2. Description of the Related Art

A capacitor is a key component of a dynamic random access memory (DRAM) device. Especially, the quality of a DRAM device does strongly depend on performance of the capacitor. In addition, as the DRAM fabrication technology achieves the deep sub-micron level, it is a crucial issue to reduce the dimension of a DRAM device, meanwhile, increase the capacitance without degrading the quality.

Currently, there are two main considering points to improve capacitance with reduced dimension. One is using a dielectric material with high dielectric constant K, and the other one is increasing the capacitor surface. The dielectric material with high dielectric constant includes, for example, tantalum oxide ($Ta_2O_5$) with K about equal to 25 or barium titanate ($BaTiO_3$) with K even as high as about 1000. About the solution of increasing the capacitor surface, there are also two main methods. The two types of formed capacitors are called a deep-trench type and a stack type respectively. The deep-trench capacitor typically includes a trench with a depth of about 6–7 microns. After filling the deep trench with a dielectric material, a deep-trench capacitor is formed. The deep-trench capacitor can have a large capacitance but it is difficult to be formed. The stack-type capacitor is the main type for the current fabrication trend since the stack-type capacitor has many advantages, for example, the high capacitance and the well-performed manufacturing technique.

The hemispherical grains (HSG) and the selective hemispherical grains (SHSG) technologies play a major role in modern DRAM manufacturing processes. FIG. 1A shows a cross-sectional view of a conventional stack-type capacitor. As shown in FIG. 1A, a SHSG layer 108 of the capacitor is formed by using the SHSG method. For better understanding, a substrate 100, a conductive plug 102, a dielectric layer 104, an amorphous silicon layer 106, a dielectric layer 110, and a conductive layer 112 served as the upper electrode are also shown in FIG. 1A. The SHSG layer 108 is formed by performing a seeding process in a ultra high vacuum (UHV) environment with gas of silane ($SiH_4$) or disilane ($Si_2H_6$) and a thermal process in situ.

FIG. 1B shows a time vs. temperature diagram of a conventional SHSG seeding process. Steps of loading wafers and sequentially heating the wafers are indicated by line 10. Line 12 represents serial steps of sealing the UHV reactor, performing about 12 cycles of helium purge process, and heating the wafers to a temperature of a SHSG seeding reaction. Line 14 indicates the SHSG seeding stage. It is noted that the seeding process requires an environment of an extremely high purity, but various contaminants always exist. Typical contaminants, for example, oxygen and organics, appear apparently when wafers are heated up. In order to prevent contaminations from wafer outgassing, Helium (He) gas flows are previously introduced into the chamber of a UHV system before performing the SHSG seeding process. However, as a matter of fact, the He purge process is still unable to remove the contamination source effectively. For example, it is found that capacitance values of capacitors on wafers located near the upper end of a vertical furnace or chamber of a UHV reactor are often lower. The yield ratio of the DRAM devices thus cannot be improved further. Two possible reasons are the pump position of the UHV reactor and the inertia of He gas. That is, the ultra high vacuum pump is usually disposed bn the bottom end of the UHV reactor and the noble He gas cannot react with the contaminants. In view of the issue mentioned above, it is very necessary to provide a solution to improve the yield ratio and lower the cost of the DRAM device manufacture. The invention used an additional silane purge process in situ is just the answer.

SUMMARY OF THE INVENTION

It is therefore an object of the invention to provide a method for upgrading qualities of DRAM capacitors by effectively removing contaminants appeared in an UHV reactor in a SHSG seeding process.

It is another object of this invention to improve the yield ratio of the DRAM devices and the wafer-to-wafer capacitance uniformity.

It is a further object of this invention to lower the cost of the DRAM device manufacture.

It is still another object of this invention to provide a convenient and high efficient purge process.

To achieve these objects, and in accordance with the purpose of the invention, the invention use an additional silane purge process in situ to effectively purge out potential contamination sources amid a conventional SHSG seeding process. First of all, wafers having semifinished DRAM therein are loaded. Then the wafers are transferred into a reactor chamber of an ultra high vacuum process module.

Furthermore, the wafers are heated. Then the reactor chamber is sealed. Then a silane purge cycle comprising introducing and extracting a silane gas is performed in the reactor chamber for several times. Moreover, a helium purge cycle comprising introducing and extracting a helium gas is performed for several times in situ. Finally, a seeding process is performed on the wafers.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
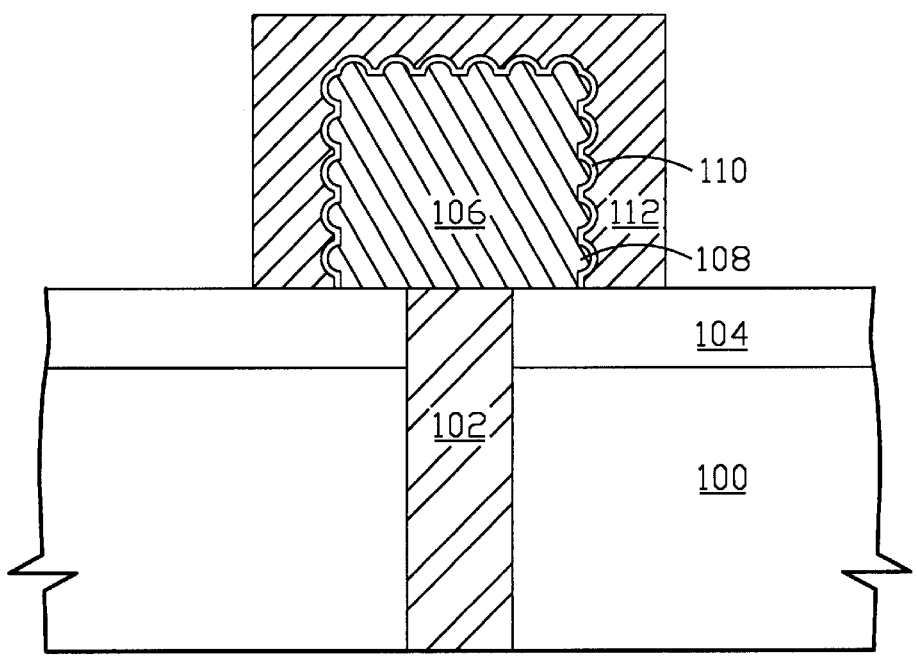
FIG. 1A shows a cross-sectional view of a conventional stacktype capacitor.
Figure 1B:
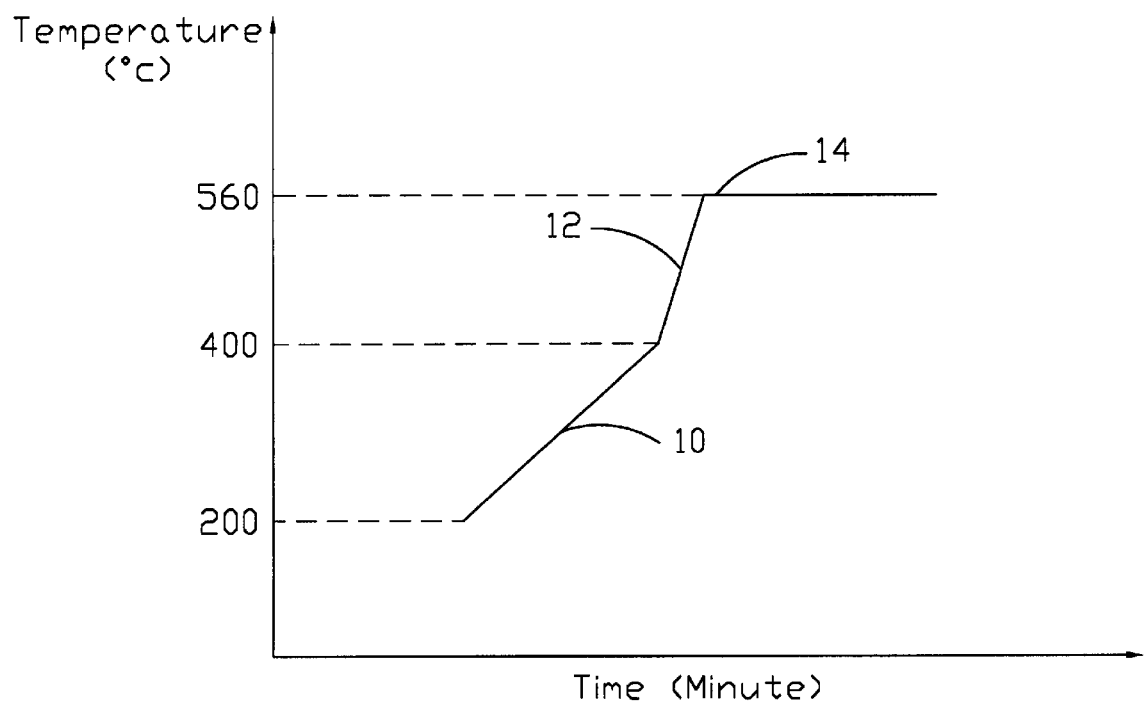
FIG. 1B shows a time vs. temperature diagram of a conventional SHSG seeding process.
Figure 2A:
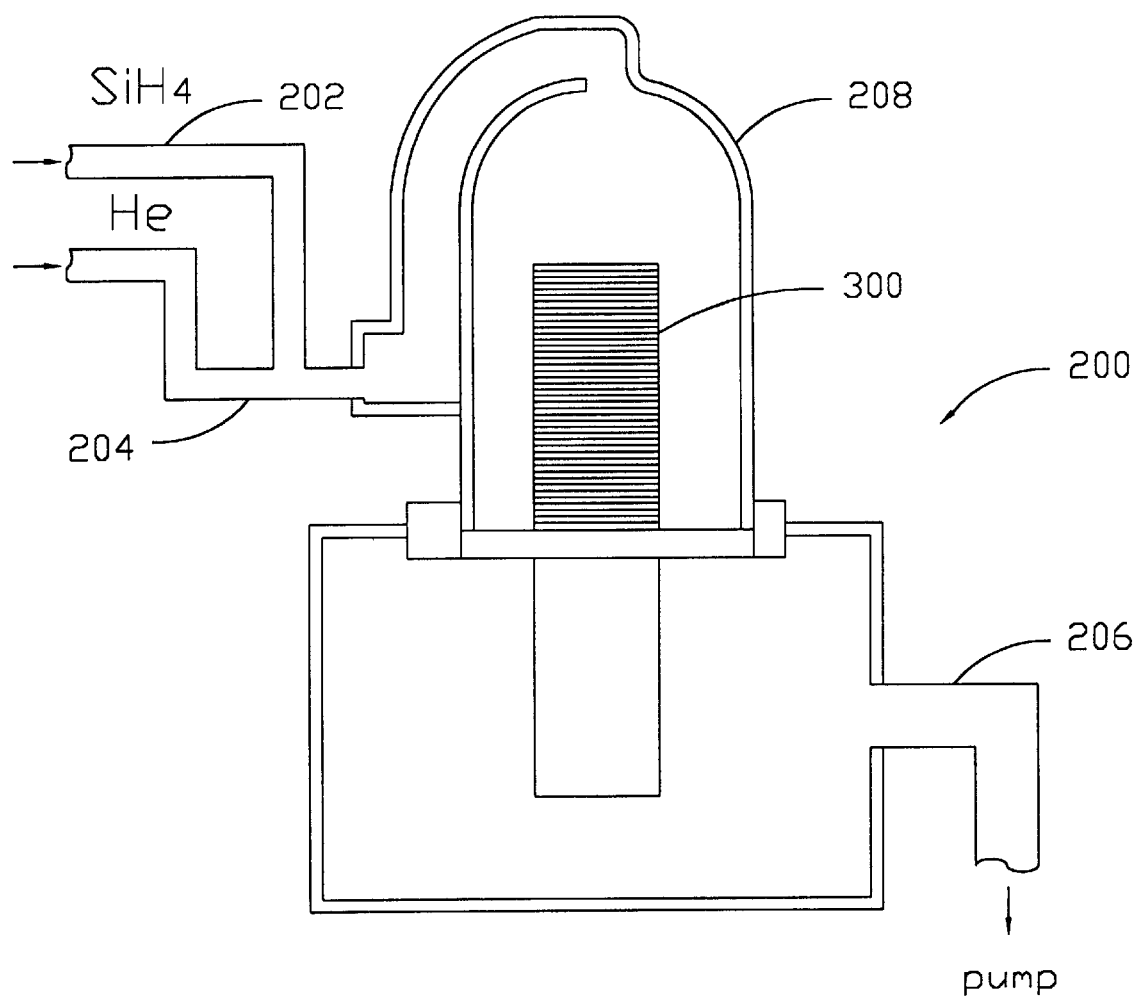
FIG. 2A shows a schematic diagram of a conventional UHV reactor used to perform the SHSG seeding process of the invention.

Referring to FIG. 2A, a schematic diagram of a conventional UHV reactor 200 used to perform the SHSG seeding process is shown. It is noted that the portions of the UHV reactor 200 that are not essential for describing this invention are omitted. Two gas inlet tubes 202 and 204 are used to introduce silane and helium gas respectively. The gas inlet tube 202 is used to introduce silane gas to perform the SHSG seeding process on wafers 300 on a quartz load boat which is not shown. The gas inlet tube 204 is used to introduce helium gas to purge out contaminants and the helium gas together with the contaminants are extracted via a gas outlet tube 206 by a ultra high vacuum pump which is also not shown. To compare the method of the invention with the conventional one used in the DRAM industry as shown in FIG. 1B, the conventional SHSG seeding process flow performed in the UHV reactor 200 will be previously described hereinafter. First of all, wafers 300 on the load boat are transferred into a reactor chamber 208 of the UHV reactor 200. Then the wafers 300 inside the reactor chamber 208 are heated from about 200° C. to about 400° C. Next the reactor chamber 208 is sealed and the atmosphere is extracted by the ultra high vacuum pump. Then the wafers 300 are heated from about 400° C. to about 560° C., meanwhile, about 12 cycles of helium purge process are proceeded to remove various contaminants inside the reactor chamber 208 via the gas outlet tube 206. Finally, silane and helium gas mixture is introduced to perform the SHSG seeding reaction on the wafers 300 at about 560° C. The method set forth is found that capacitance values of capacitors on the wafers near the upper end of the reactor chamber 208 are always apparently lower than the average. Therefore the invention is provided to effectively improve both the wafer-to-wafer capacitance uniformity and the yield ratio with minimum increasing cost. The method of the invention will now be described hereinafter. Firstly, the wafers 300 on the quartz load boat are transferred into the reactor chamber 208 of the same UHV reactor 200 and the wafers 300 inside the reactor chamber 208 are sequentially heated from about 200° C. to about 410° C. Then the reactor chamber 208 is sealed and the atmosphere is extracted by the ultra high vacuum pump. Next a silane gas is introduced into the reactor chamber 208 via the gas inlet tube 202 and extracted via the gas outlet tube 206 to purge out the contaminants. This cycle should be performed for many times. The flow rate of the silane gas is about 5 to about 10 sccm (standard cubic centimeter per minute) and the reacting time is about 30 minutes to about 60 minutes. The pressure inside the reactor chamber 208 is preferably about $10^{-3}$ torr to about $10^{-4}$ torr and the temperature is about 400° C. to about 410° C. Then the wafers 300 are heated from a temperature range of about 400° C. to about 410° C. to a temperature range of about 550° C. to about 560° C., meanwhile, about 12 cycles of helium purge process with a flow rate of about 100 sccm are proceeded to remove various contaminants inside the reactor chamber 208 via the gas outlet tube 206. Finally, silane and helium gas mixture is introduced to perform the SHSG seeding reaction on the wafers 300 at the temperature range of about 550° C. to about 560° C.

Figure 2B:
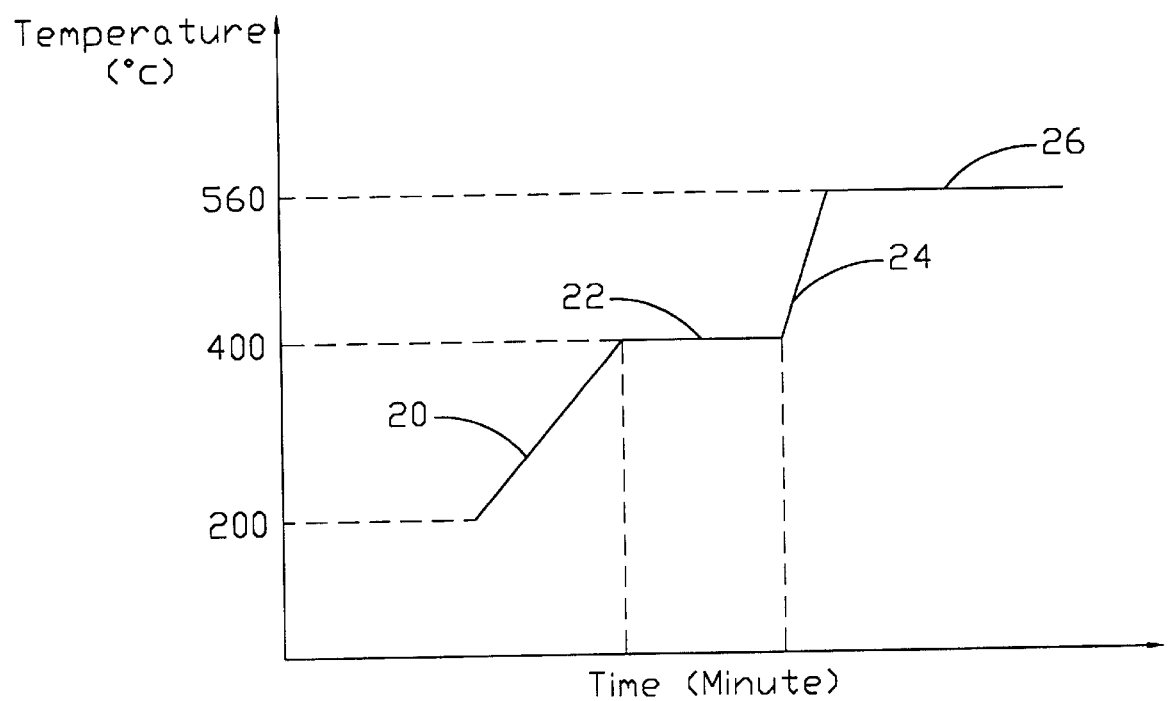
FIG. 2B shows a time vs. temperature diagram of the seeding process flow of the invention.

FIG. 2B shows the time vs. temperature diagram of the process flow of the invention. Line 20, similar to line 10 in FIG. 1B, indicates steps of loading wafers 300 and sequentially heating the wafers 300. Line 22 shows an additional silane purge stage of this invention. Line 24, similar to line 12, indicate serial steps of sealing the reactor chamber 208 of the UHV reactor 200, performing about 12 cycles of helium purge process, and heating the wafers 300 to a temperature of a SHSG seeding reaction. Line 26 designates the SHSG seeding stage.

Figure 2C:
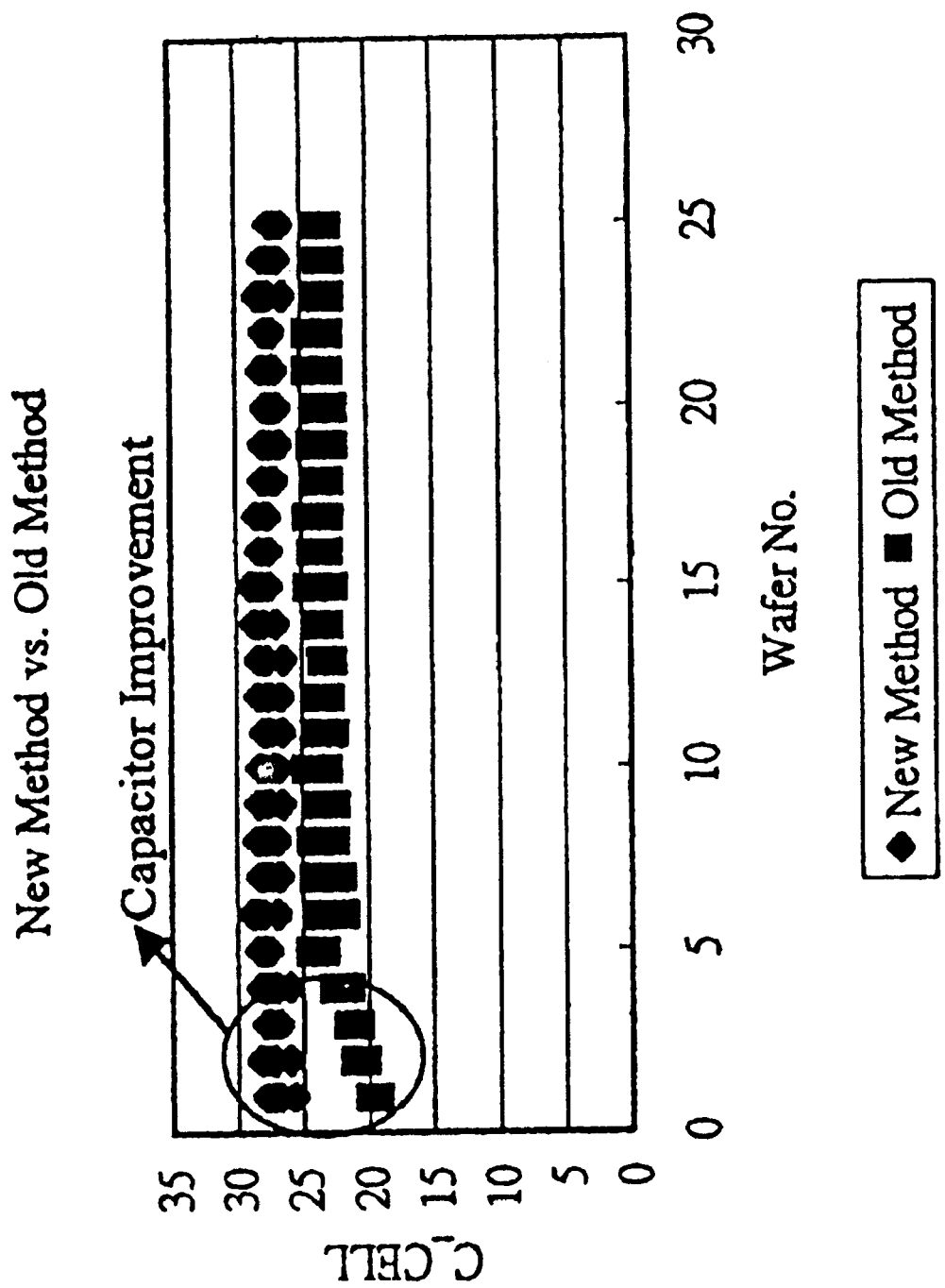
FIG. 2C shows a result of measuring DRAMs capacitances of two lots of wafers seeded by using the method of the invention and the conventional one respectively.

Referring to FIG. 2C, a comparison between two lots of wafers having DRAMs therein made by the conventional seeding process shown in FIG. 1B and the new seeding process of the present invention shown in FIG. 2B respectively is shown. Both lots of the wafers are seeded in a UHV reactor similar to the one shown in FIG. 2A. Results of measuring the capacitance values of the DRAMs show that the method of the invention effectively improves the quality of the DRAMs capacitors of the wafers located near the upper end of the UHV reactor (wafer number 1 to 5) and the wafer-to-wafer uniformity. The capacitance values are obtained by measuring five points each wafer.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claim is:

1. A method for upgrading qualities of DRAM capacitors and wafer-to-wafer uniformity, said method comprising:

providing semiconductor wafers;

transferring said semiconductor wafers into a reactor chamber of an ultra high vacuum process module;

elevating the temperature of said reactor chamber to a first temperature;

sealing said reactor chamber;

performing a plurality of first purge cycles on said semiconductor wafers at said first temperature, said first purge cycle comprising introducing a silane gas into said reactor chamber and extracting said silane gas;

performing a plurality of second purge cycles on said semiconductor wafers and elevating the temperature of said reactor chamber to a second temperature, said second purge cycle comprising introducing a helium gas into said reactor chamber and extracting said helium gas;

and performing a seeding process on said semiconductor wafers at said second temperature.

2. The method according to claim 1, wherein said first temperature is in a range of about 400° C. to about 410° C.

3. The method according to claim 1, wherein said first purge cycles are performed at a pressure of about $10^{-3}$ torr to about $10^{-4}$ torr.

4. The method according to claim 1, wherein said first purge cycles are performed for a purge time of about 30 minutes to about 60 minutes.

5. The method according to claim 1, wherein said silane gas is introduced at a flow rate of about 5 sccm to about 10 sccm.

6. The method according to claim 1, wherein said second temperature is in a range of about 550° C. to about 560° C.

7. The method according to claim 1, wherein said helium gas are introduced at a flow rate of about 100 sccm to about 200 sccm.

8. The method according to claim 1, wherein said seeding process comprises a hemispherical grain seeding process, and is preferably a selective hemispherical grain seeding process.

9. A method for upgrading qualities of DRAM capacitors and wafer-to-wafer uniformity, said method comprising:

providing semiconductor wafers;

transferring said semiconductor wafers into a reactor chamber of an ultra high vacuum process module;

elevating the temperature of said reactor chamber to a first temperature;

sealing said reactor chamber;

performing a plurality of first purge cycles on said semiconductor wafers at said first temperature, said first purge cycle comprising introducing a silane gas into said reactor chamber and extracting said silane gas;

performing a plurality of second purge cycles and elevating the temperature of said reactor chamber to a second temperature, said second purge cycle comprising introducing a helium gas into said reactor chamber and extracting said helium gas; and performing a selective hemispherical grain seeding process on said semiconductor wafers at said second temperature.

10. The method according to claim 9, wherein said first temperature is in a range of about 400° C. to about 410° C.

11. The method according to claim 9, wherein said first purge cycles are performed at a pressure of about $10^{-3}$ torr to about $10^{-4}$ torr.

12. The method according to claim 9, wherein said first purge cycles are performed for a purge time of about 30 minutes to about 60 minutes.

13. The method according to claim 9, wherein said silane gas is introduced at a flow rate of about 5 sccm to about 10 sccm.

14. The method according to claim 9, wherein said second temperature is in a range of about 550° C. to about 560° C.

15. The method according to claim 9, wherein said helium gas are introduced at a flow rate of about 100 sccm to about 200 sccm.

16. A method for upgrading qualities of DRAM capacitors and wafer-to-wafer uniformity, said method comprising:

providing semiconductor wafers;

transferring said semiconductor wafers into a reactor chamber of an ultra high vacuum process module;

elevating the temperature of said reactor chamber to a temperature of about 400° C.;

sealing said reactor chamber;

performing a plurality of first purge cycles on said semiconductor wafers at about 400° C., said first purge cycle comprising introducing a silane gas into said reactor chamber and extracting said silane gas;

performing a plurality of second purge cycles and elevating the temperature of said reactor chamber to about 560° C., said second purge cycle comprising introducing a helium gas into said reactor chamber and extracting said helium gas ; and performing a selective hemispherical grain seeding process on said semiconductor wafers at about 560° C.

17. The method according to claim 16, wherein said first purge cycles are performed at a pressure of about $10^{-3}$ torr to about $10^{-4}$ torr.

18. The method according to claim 16, wherein said first purge cycles are performed for a purge time of about 30 minutes to about 60 minutes.

19. The method according to claim 16, wherein said silane gas is introduced at a flow rate of about 5 sccm to about 10 sccm.

20. The method according to claim 16, wherein said helium gas are introduced at a flow rate of about 100 sccm to about 200 sccm.

* * * * *